United States Patent [19]

Ahn

[11] Patent Number: 6,094,389
[45] Date of Patent: Jul. 25, 2000

[54] SEMICONDUCTOR MEMORY APPARATUS HAVING REFRESH TEST CIRCUIT

[75] Inventor: Yeong-Chang Ahn, Cheongju, Rep. of Korea

[73] Assignee: Hyundai Micro Electronics Co., Ltd., Cheongju, Rep. of Korea

[21] Appl. No.: 09/385,436

[22] Filed: Aug. 30, 1999

[30] Foreign Application Priority Data

Mar. 27, 1999 [KR] Rep. of Korea ............ 99-10675

[51] Int. Cl.[7] ............................................. G11C 7/00
[52] U.S. Cl. ................. 365/201; 365/230.03; 365/222
[58] Field of Search ..................... 365/201, 222, 365/230.03

[56] References Cited

U.S. PATENT DOCUMENTS 5,959,930  9/1999  Sakurai ........................ 365/230.03
5,987,632  11/1999  Irrinki et al. ..................... 365/201 X

*Primary Examiner*—Huan Hoang
*Attorney, Agent, or Firm*—Fleshner & Kim, LLP

[57] ABSTRACT

A semiconductor memory apparatus having a refresh test circuit provided with a control unit, a write control unit, a row address buffer and column address buffer, a refresh address counter, a refresh control unit, a column decoder, a data input/output buffer, a plurality of sense amplifier arrays and a plurality of memory cell arrays, includes a refresh test control unit for receiving an address signal by the control of the control unit and controlling the refresh control unit, the row block decoder and the plurality of sense amplifier arrays. The apparatus screens refresh-related poor products by efficiently applying a disturb refresh test during a short period of time.

7 Claims, 5 Drawing Sheets

SEMICONDUCTOR MEMORY APPARATUS HAVING REFRESH TEST CIRCUIT

BACKGROUND OF THE INVENTION

1. Field of the Invention

The present invention relates to a semiconductor memory apparatus having a refresh test circuit, and more particularly, to an improved semiconductor memory apparatus having a refresh test circuit, capable of separately testing the refresh of a memory cell.

2. Description of the Background Art

FIG. 1 is a block diagram of a semiconductor memory apparatus having a refresh test circuit according to the conventional art.

As shown therein, the apparatus includes a data input/output buffer 1 for a temporary storage so as to output the data stored in a memory cell, a write control unit 2 for receiving a write enable signal WEB and controlling the data input/output buffer 1, a row address buffer 3 and a column address buffer 6 for temporarily storing address signals A0–An, a refresh address counter 4 for refreshing memory cells, a refresh control unit 5 for controlling the refresh address counter 4, a row block decoder 7 and a plurality or row decoders 8a–8e for receiving the row address applied to the row address buffer 3 and generating a real address for accessing memory cells, a column decoder 10 for receiving the column address applied to the column address buffer 6 and generating a real address for accessing the memory cell, a plurality of sense amplifier arrays 12a, 12b for amplifying the externally applied data and storing the same in the memory cell, a plurality of memory cell arrays 9a–9e provided with the memory cells selected by the plurality of row decoders 8a–8e and the column decoder 10, and a control unit 11 for receiving a row address strobe signal RASB and a column address strobe signal CASB and controlling respective units accordingly.

The thusly constituted conventional semiconductor memory apparatus having a reference test circuit will now be described.

First, when address signals A0–An are applied to the row address buffer 3 and the column address buffer 6, the row decoders 8a–8e select word lines by the row address applied to the row address buffer 3 and the column decoder 10 outputs a column selection signal (that is, Y selection signal YS) by the column address applied to the column address buffer 6 and selects corresponding memory cells of the memory cell arrays 9a–9e.

Here, the number of address signals A0–An and the number of row decoders 8a–8e or the number of signals applied to the column decoder 10 are determined depending upon a product specification (for example, x4, x8, x16, etc.) and memory concentration (for example, 4M, 16M, 64M, etc.). Also, as the number of words of a memory increases, so does the number of signals applied to the decoder for thereby increasing the number of word lines and bit lines which determine the address of memory cells.

The block diagram shown in FIG. 1 illustrates a 16M×4/4K refresh product, wherein the number of signals applied to respective portions is calculated such that the number of address signals is 12 (A0–A11) and the output number M of the refresh address counter 4 determined by the number of refresh cycle also becomes 12.

In addition, the input of the row block decoder 7 for selecting memory cell arrays 9a–9e is determined according to a composition of memory cell arrays or sensitivity of a sense amplifier and power consumption. In general, the number of word lines cared by one of the decoders 8a–8e ranges from 256 to 512 so that the increase of the memory concentration causes the number increase of the memory cell arrays 9a–9e, whereby the number of address signals allotted to the row block decoder 7 is increased as well. Accordingly, if the number of word lines of the memory cell arrays is set as 512, the number of address signals for decoding the row decoder becomes 9 (AX0–AX8) and the block decoding address number becomes 3 (AX9–AX11) and the number of memory cell arrays becomes 8.

The thusly constituted semiconductor memory apparatus becomes a 64M (16M words*4 bits) memory apparatus having 23 memory cell arrays, 212 word lines and 212 bit lines.

FIGS. 2A through 2C illustrate a test method of respective refresh tests for a semiconductor memory apparatus.

The refresh tests include a pause (static) refresh test and a disturb refresh test. In the pause refresh test, data is simply written in all the memory cells and read after a predetermined time period, wherein the test has some difference from a real application environment of the memory cells and it checks basic characteristics of DRAM memory cells generating constant discharge.

Meanwhile, the disturb refresh test is tested such that the background data is written in all the cells while the data in the ambient memory cells is changed, or the ambient word lines and bit lines are continuously activated during the refresh test time period.

As shown in FIG. 2B, the disturb-1 refresh test is the simplest disturb refresh test, wherein even numbers or odd numbers of word lines are continuously activated during the refresh time tREF so as to check data.

Also, as shown in FIG. 2C, the disturb-2 or disturb-3 refresh test is implemented with regard to respective word lines (here, 2M lines) driven by the row decoders 8a–8e for activating the word lines of the memory cell arrays 9a–9e.

However, as the memory integration of memory cells are increased and memory cell processing becomes further difficult, so the refresh characteristic of the memory cells becomes further deteriorated.

In addition, if integration of a semiconductor memory apparatus is increased, the number of word lines and column selection lines for driving respective memory cells is also increased, so that the number of cycles for testing memory cells and the time for testing is exponentially increased.

SUMMARY OF THE INVENTION

The present invention is directed to overcoming the conventional disadvantages.

Therefore, it is an object of the present invention to provide a semiconductor memory apparatus having a refresh test circuit, capable of screening refresh-related poor products by efficiently applying a disturb refresh test during a short period of time.

To achieve the above-described object, there is provided a semiconductor memory apparatus having a refresh test circuit according to the present invention which includes a data input/output buffer for temporarily storing and outputting data stored in a memory cell, a write control unit for receiving a write enable signal and controlling the data input/output buffer, a row address buffer and a column address buffer for receiving address signals and temporarily storing therein, a refresh address counter for refreshing the memory cell, a refresh control unit for controlling the refresh address counter, a row block decoder and a plurality of row decoders for receiving a row address from the row address buffer and generating a real address for accessing the memory cell, a column decoder for receiving the column address signal from the column address buffer and generating a real address for accessing the memory cell, a plurality of sense amplifier arrays for amplifying the data stored in a selected memory cell or storing an externally amplified data in the memory cell, a plurality of memory cell arrays having memory cells selected by the plurality of row decoders and the column decoder, a refresh test control unit for controlling the row block decoder and the refresh control unit, and a control unit for receiving a row address strobe signal, a column address strobe signal and a write enable signal so as to control respective units.

The features and advantages of the present invention will become more readily apparent from the detailed description given hereinafter. However, it should be understood that the detailed description and specific example, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

With reference to the accompanying drawings, the preferred embodiments of the present invention will now be described.

Figure 3:
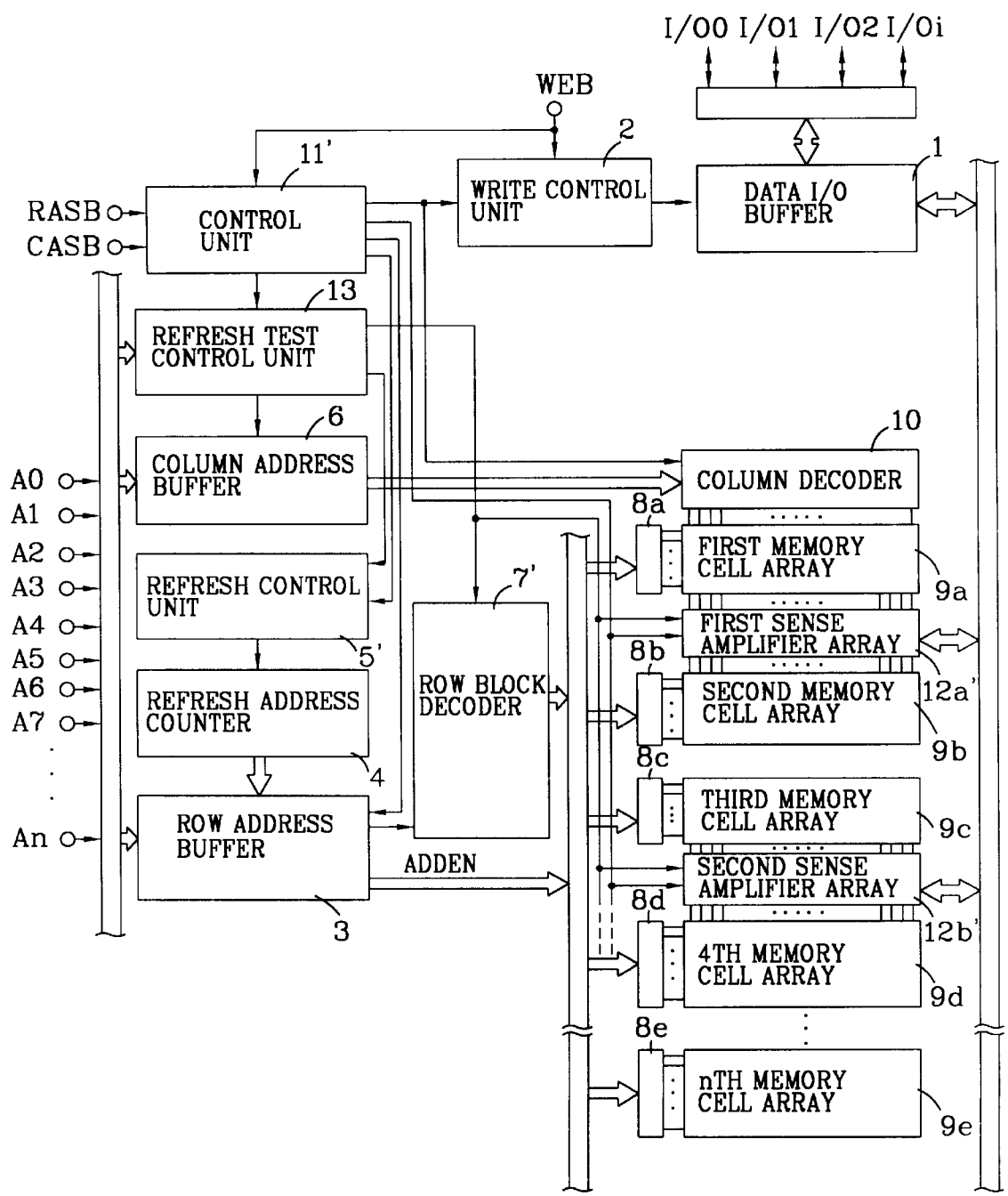
FIG. 3 is a block diagram illustrating a semiconductor memory apparatus having a refresh test circuit according to the present invention.

FIG. 3 is a block diagram illustrating a semiconductor memory apparatus having a refresh test circuit. As shown therein, the apparatus includes a data input/output buffer 1 for temporarily storing and outputting the data stored in a memory cell, a write control unit 2 for receiving a write enable signal WEB and controlling the data input/output buffer 1, a row address buffer 3 and a column address buffer 6 for receiving address signals A0–An and temporarily storing therein, a refresh address counter 4 for refreshing the memory cell, a refresh control unit 5' for controlling the refresh address counter 4, a row block decoder 7' and a plurality of row decoders 8a–8e for receiving a row address from the row address buffer 3 and generating a real address for accessing the memory cell, a column decoder 10 for receiving the column address signal from the column address buffer 6 and generating a real address for accessing the memory cell, a plurality of sense amplifier arrays 12a', 12b' for amplifying the data stored in a selected memory cell or storing an externally amplified data in the memory cell, a plurality of memory cell arrays 9a–9e having memory cells selected by the plurality of row decoders 8a–8e and the column decoder 10, a refresh test control unit 13 for controlling the row block decoder 7' and the refresh control unit 5', and a control unit 11' for receiving a row address strobe signal RASB, a column address strobe signal CASB and a write enable signal WEB so as to control respective units.

Here, the same elements as the conventional art given same reference numerals.

Figure 4:
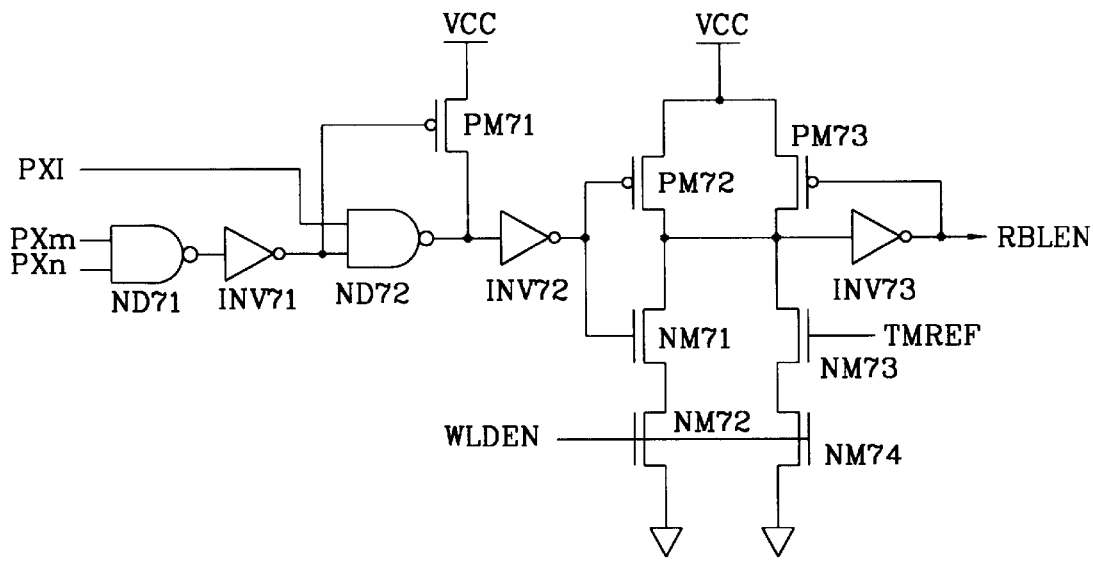
FIG. 4 is a circuit view detailing a row block decoder in the circuit of FIG. 3.
Figure 5:
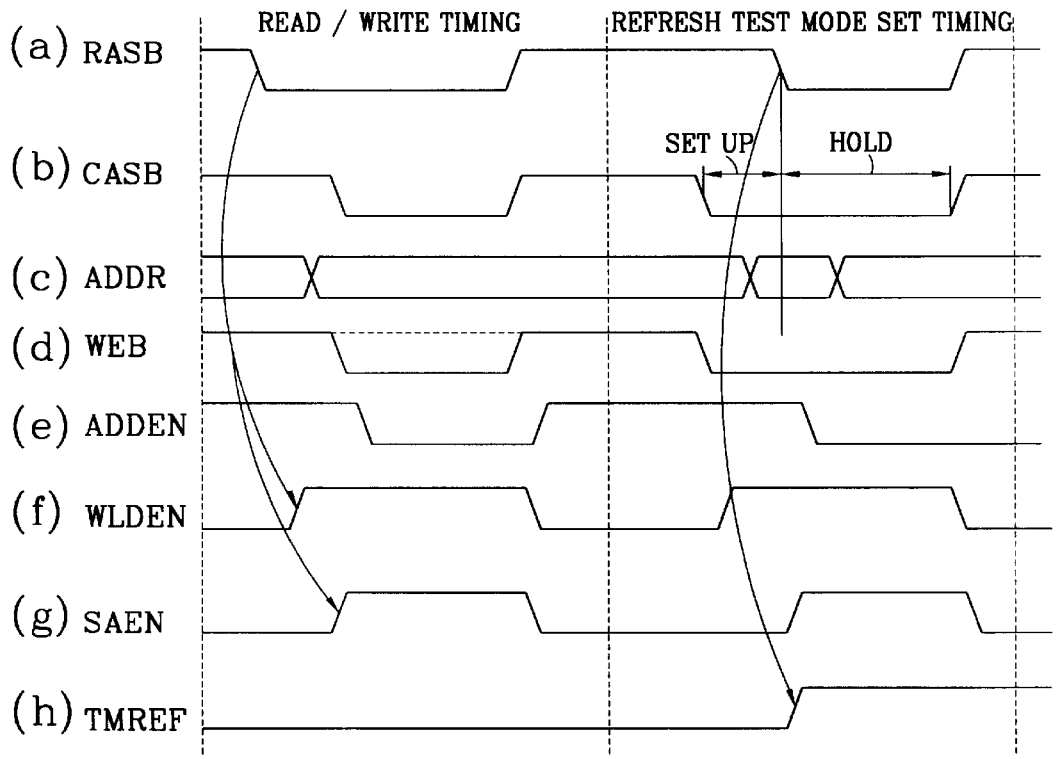
FIG. 5 is waveform views illustrating respective operations in FIG. 3.
Figure 6:
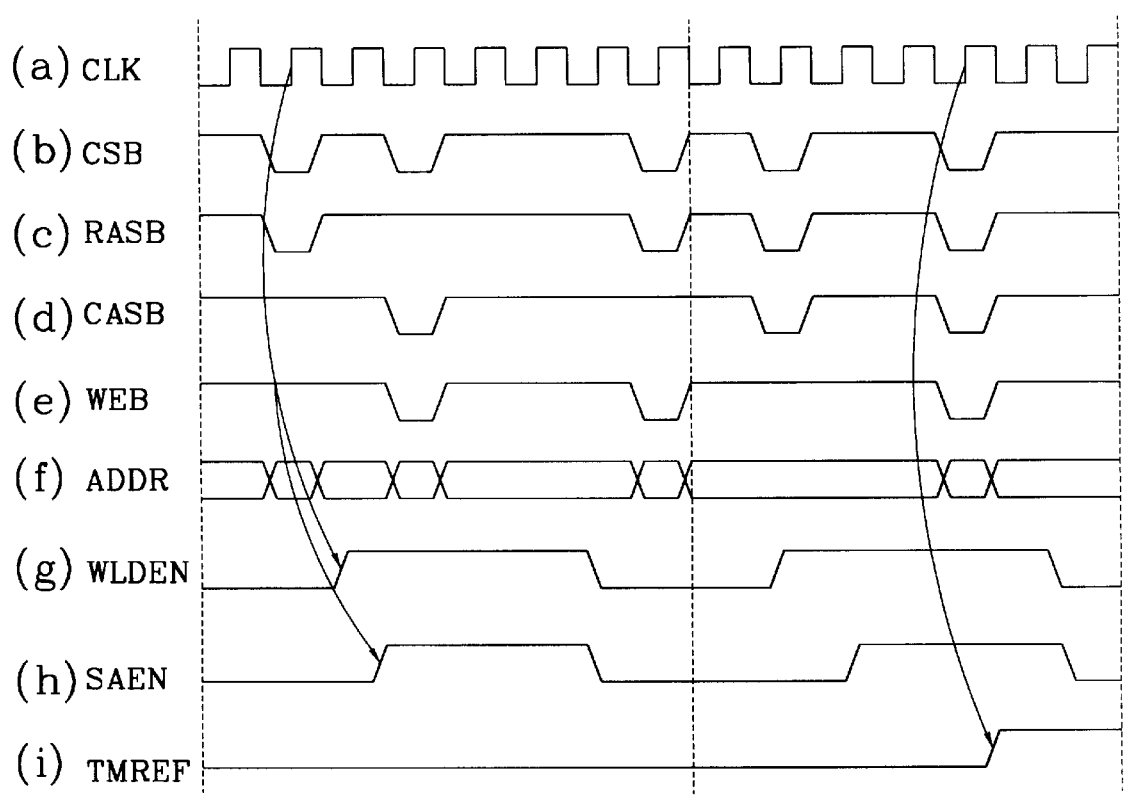
FIG. 6 is waveform views illustrating SDRAM operations of respective locks in FIG. 3.

As shown in FIG. 4, the row block decoder 7' includes a first NAND gate ND71 for NANDing second and third block predecoding signals PXm, PXn, a first inverter INV71 for inverting an output of the first NAND gate ND71, a second NAND gate ND72 for NANDing the output of the first inverter INV71 and a first block predecoding signal PX1, a first PMOS transistor PM71 with its source applied to supply voltage VCC, its drain connected to an output terminal of the second NAND gate ND72 and its gate connected to an output of the first inverter INV71, a second inverter INV72 for inverting the output of the second NAND gate ND72, a second PMOS transistor PM72 and a first NMOS transistor NM72 serially connected between the supply voltage and ground voltage VSS and their gates connected in common and applied by the output of the second inverter INV72, a second NMOS transistor NM72 having its gate applied by a word line driving enable signal WLDEN, a third PMOS transistor PM73 serially connected between the supply voltage VCC and ground voltage VSS and having its gate applied by a row block enable signal RBLEN, a third NMOS transistor NM73 having its gate applied by a refresh test mode enable signal TMREF, a fourth NMSO transistor NM74 having its gate applied by a word line driving enable signal WLDEN, and a third inverter INV73 for inverting the voltage at a node connected in common to the common drain of the second PMSO transistor PM72 and the first NMOS transistor NM71 and to the common drain of the third PMOS transistor PM73 and the third NMOS transistor NM73 and outputting the row block enable signal RBLEN.

The thusly constituted semiconductor memory apparatus having a refresh test circuit according to the present invention will now be described in further detail.

First, when the refresh test mode enable signal TMREF of the refresh test control unit 13 is transited from low to high level so as to select a refresh test mode, the refresh control unit 5' confines the address generated from the refresh address counter 4 to the range within the memory cell array 9a and it is applied to the row block decoder 7' so as to activate the row block enable signal RBLEN without regard to the block decoding address, whereby the row decoder of all the memory cell arrays 9a–9e becomes operated.

Also, the refresh test mode enable signal TMREF is applied to the sense amplifier arrays 12a', 12b' so that all the data inputted/outputted during the read and write cycle are controlled so as to be transferred parallel to all the memory cell arrays.

FIGS. 5A–5H are waveform views of a general memory operation according to the present invention and FIGS. 6A–6I are waveform views of an SDRAM memory operation according to the present invention.

The refresh test mode according to the present invention does not employ a general memory control signal WCBR (WCBR; WE CAS before RAS) and it can be set as address key code. Further, in order to prevent such a mode from being easily set, a high voltage VSCC is applied to a particular address and the circuit should be connected for operation of the set mode.

The above case is applied to SDRAM memory in the same way.

Figure 1:
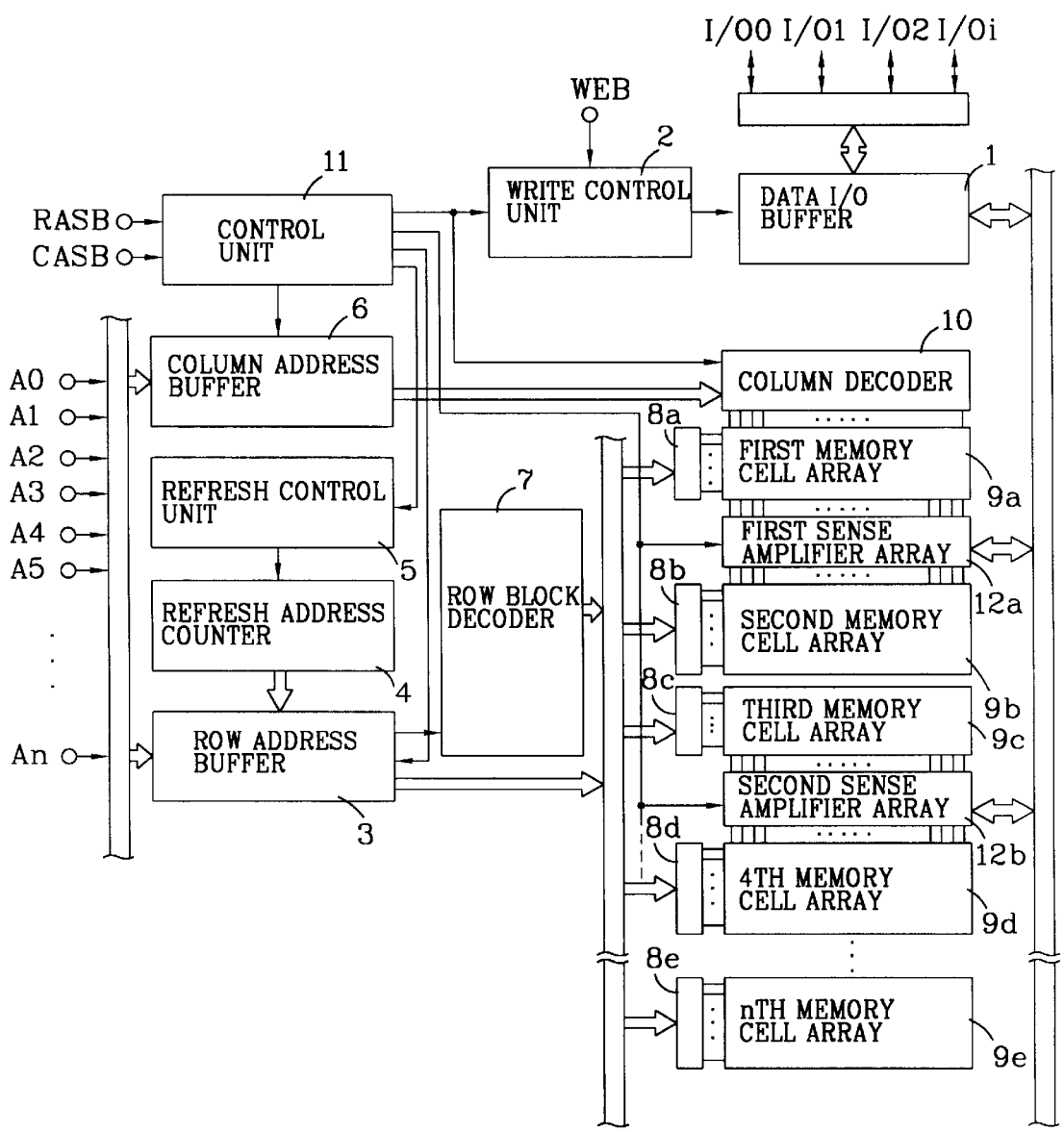
FIG. 1 is a block diagram illustrating a semiconductor memory apparatus having a refresh test circuit according to the conventional art.
Figure 2:
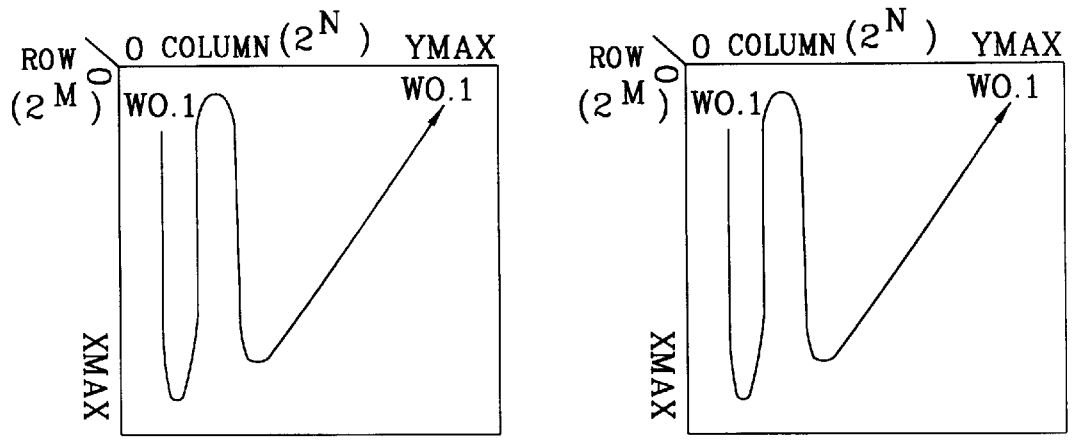
FIGS. 2A–2C are graphs illustrating refresh test methods of a semiconductor memory apparatus.

As shown in FIG. 2C, when the disturb-2 or disturb-3 refresh test method is applied to the semiconductor memory apparatus according to the present invention, all the row decoders 8a–8e of the memory cell arrays 9a–9e are operated, whereby the test address is decreased to X=XMAX/2i in comparison to the conventional art for thereby enabling the decrease of test time as much.

In such a test method according to the present invention, when simultaneously testing a plurality of memory cell arrays, the memory cells of the respective memory cell arrays being tested are thoroughly separated, so that the test result has no difference in comparison to the conventional art while decreasing test time by ½i.

As described above, the semiconductor memory apparatus having a refresh test circuit according to the present invention enables all the row decoders to operate when simultaneously testing a plurality of cell arrays, so that the memory cells of the respective memory cell arrays are completely separated, thereby decreasing test time without deteriorating reliability of the test.

As the present invention may be embodied in various forms without departing from the spirit of the essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within meets and bounds of the claims, or equivalences of such meets and bounds are therefore intended to be embraced by the appended claims.

What is claimed is:

1. A semiconductor memory apparatus having a refresh test circuit, comprising:

a data input/output buffer for temporarily storing and outputting data stored in a memory cell;

a write control unit for receiving a write enable signal and controlling the data input/output buffer;

a row address buffer and a column address buffer for receiving address signals and temporarily storing therein;

a refresh address counter for refreshing the memory cell;

a refresh control unit for controlling the refresh address counter;

a row block decoder and a plurality of row decoders for receiving a row address from the row address buffer and generating a real address for accessing the memory cell;

a column decoder for receiving the column address signal from the column address buffer and generating a real address for accessing the memory cell;

a plurality of sense amplifier arrays for amplifying the data stored in a selected memory cell or storing an externally amplified data in the memory cell;

a plurality of memory cell arrays having memory cells selected by the plurality of row decoders and the column decoder;

a refresh test control unit for controlling the row block decoder and the refresh control unit; and a control unit for receiving a row address strobe signal, a column address strobe signal and a write enable signal so as to control respective units.

2. The apparatus of claim 1, wherein the refresh control unit receives a refresh test mode enable signal of the refresh test control unit and controls the refresh address counter.

3. The apparatus of claim 1, wherein the row block decoder receives a refresh test mode enable signal of the refresh test control unit and controls the row decoder.

4. The apparatus of claim 1, wherein the plurality of sense amplifier arrays receives a refresh test mode enable signal of the refresh test control unit and controls a data writing in memory cells by simultaneously transferring the applied data to all the memory cell arrays.

5. The apparatus of claim 1, wherein the row block decoder comprises:

a first NAND gate for NANDing second and third block predecoding signals;

a first inverter for inverting an output of the first NAND gate;

a second NAND gate for NANDing the output of the first inverter and a first block predecoding signal;

a first PMOS transistor with its source applied to supply voltage, its drain connected to an output terminal of the second NAND gate and its gate connected to an output of the first inverter;

a second inverter for inverting the output of the second NAND gate;

a second PMOS transistor and a first NMOS transistor serially connected between the supply voltage and ground voltage and their gates connected in common and applied by the output of the second inverter;

a second NMOS transistor having its gate applied by a word line driving enable signal;

a third PMOS transistor serially connected between the supply voltage and ground voltage and having its gate applied by a row block enable signal;

a third NMOS transistor having its gate applied by a refresh test mode enable signal;

a fourth NMSO transistor having its gate applied by a word line driving enable signal; and a third inverter for inverting the voltage at a node connected in common to the common drain of the second PMSO transistor and the first NMOS transistor and to the common drain of the third PMOS transistor and the third NMOS transistor and outputting the row block enable signal.

6. The apparatus of claim 1, wherein the refresh address counter counts address signals generated within a range of a row decoder without regard to the number of refresh cycles at a refresh test mode.

7. The apparatus of claim 1, wherein the row block enable signal is constantly activated by the test mode enable signal without regard to address signals applied from the refresh test mode to the row decoder and the row block decoder allows all the decoders of the memory cell array to operate.

* * * * *